United States Patent
Kojima

(10) Patent No.: US 10,874,031 B2
(45) Date of Patent: Dec. 22, 2020

(54) CONTROL DEVICE

(71) Applicant: JTEKT Corporation, Osaka (JP)

(72) Inventor: Yoshihiro Kojima, Okazaki (JP)

(73) Assignee: JTEKT Corporation, Osaka (JP)

( * ) Notice: Subject to any disclaimer, the term of this patent is extended or adjusted under 35 U.S.C. 154(b) by 0 days.

(21) Appl. No.: 16/434,415

(22) Filed: Jun. 7, 2019

(65) Prior Publication Data

US 2019/0380226 A1 Dec. 12, 2019

(30) Foreign Application Priority Data

Jun. 12, 2018 (JP) ................................. 2018-112064

(51) Int. Cl.
*H05K 7/20* (2006.01)
*H05K 5/00* (2006.01)
*H05K 1/02* (2006.01)

(52) U.S. Cl.
CPC ......... *H05K 7/2049* (2013.01); *H05K 5/0052* (2013.01); *H05K 7/20409* (2013.01); *H05K 1/0215* (2013.01); *H05K 5/006* (2013.01); *H05K 5/0056* (2013.01)

(58) Field of Classification Search
CPC ........................... H05K 5/0008; H05K 5/0052
See application file for complete search history.

(56) References Cited

U.S. PATENT DOCUMENTS

| 8,627,564 | B2 * | 1/2014 | Blossfeld | H01R 12/00 29/883 |
| 2008/0002377 | A1 | 1/2008 | Kamoshida et al. | |
| 2018/0192526 | A1 * | 7/2018 | Suzuki | H05K 5/069 |

FOREIGN PATENT DOCUMENTS

JP 2008-008210 1/2008

* cited by examiner

*Primary Examiner* — Mukundbhai G Patel
(74) *Attorney, Agent, or Firm* — Oblon, McClelland, Maier & Neustadt, L.L.P.

(57) ABSTRACT

A housing includes a case made of a resin material and having an open side, and a cover that covers the open side of the case. Screw holes that are open toward the cover are formed in a side wall of the case. Through holes are formed in the cover at positions facing the respective screw holes. The cover is fastened to the case by screwing cover bolts into the respective screw holes through the respective through holes. Insertion holes are formed to extend through the side wall in an assembly direction of the cover with respect to the case. The housing is attached to an attachment target made of a metal material, by screwing attachment bolts into respective attachment holes in the attachment target through the respective insertion holes. The attachment bolts are formed to press the cover against the side wall when inserted in the respective attachment holes.

7 Claims, 4 Drawing Sheets

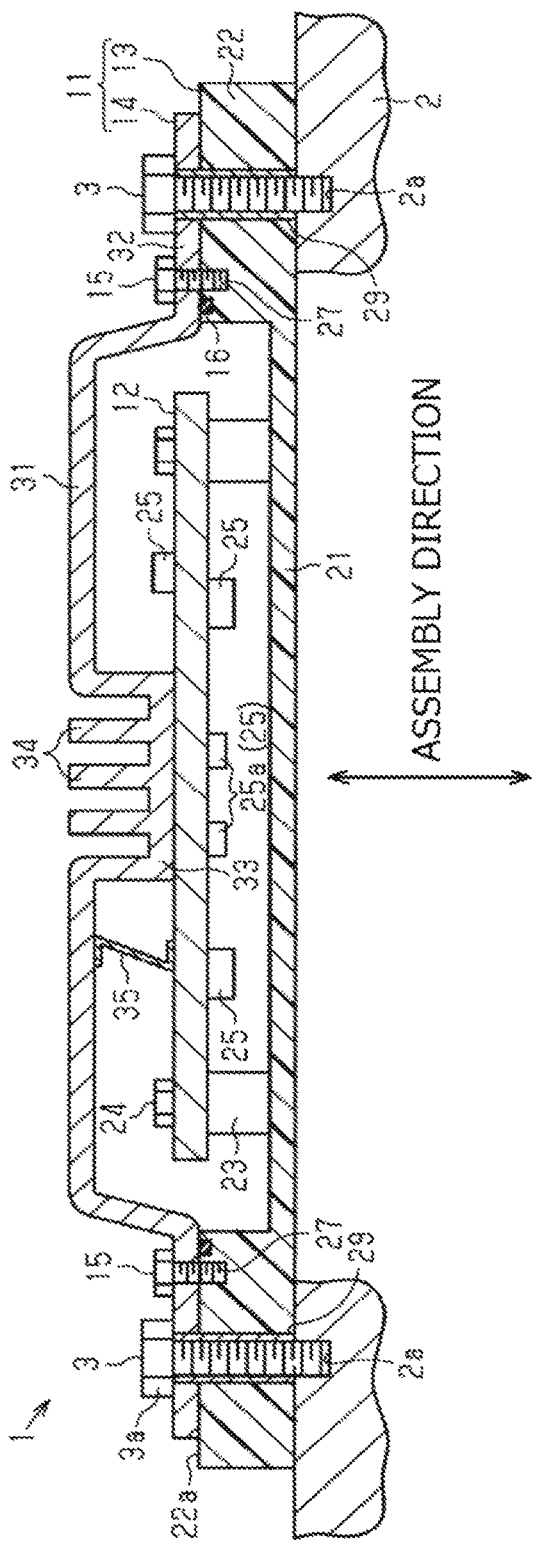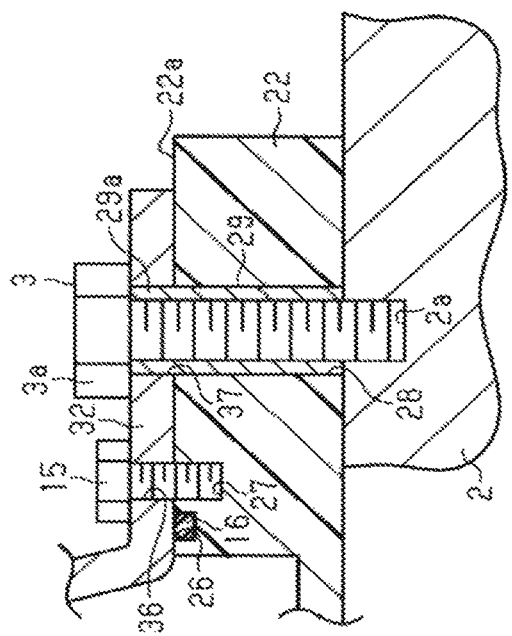

CONTROL DEVICE

INCORPORATION BY REFERENCE

The disclosure of Japanese Patent Application No. 2018-112064 filed on Jun. 12, 2018 including the specification, drawings and abstract, is incorporated herein by reference in its entirety.

BACKGROUND OF THE INVENTION

1. Field of the Invention

The present invention relates to a housing structure for a control device.

2. Description of the Related Art

There are control devices including a housing that houses a circuit board and other elements. For example, Japanese Patent Application Publication No. 2008-8210 (JP 2008-8210 A) discloses a control device including a housing and a circuit board. The housing includes a rectangular box-shaped case with an open side, and a cover that covers the open side of the case. The circuit board is housed in the housing. In the control device, the cover is fastened to the case by bolts screwed into the case. Further, a seal member is interposed between the case and the cover to seal therebetween, thereby preventing fluid such as water from entering the housing.

However, according to the technique described in JP 2008-8210 A, the case is made of a metal material, and therefore the weight is increased. This may reduce the mountability of the control device. In consideration of this, the case may be made of a resin material to reduce the weight. In this case, however, the case is easily deformed, and hence the bolts fastening the cover to the case become loose easily. Thus, fluid such as water is likely to enter the housing.

SUMMARY OF THE INVENTION

An object of the present invention is to provide a control device that allows a reduction in weight while preventing fluid from entering the housing.

According to an aspect of the present invention, there is provided a control device that includes:

a case made of a resin material and having an open side;

a housing having a cover that covers the open side of the case;

a circuit board housed in the housing; and a seal member that seals between the case and the cover.

Screw holes that are open toward the cover are formed in the case. Through holes are formed in the cover at positions facing the respective screw holes. The cover is fastened to the case by screwing cover bolts into the respective screw holes through the respective through holes. Insertion holes are formed to extend through the case in an assembly direction of the cover with respect to the case. The housing is attached to an attachment target made of a metal material, by screwing attachment bolts into respective attachment holes in the attachment target through the respective insertion holes. The attachment bolts are formed to press the cover against the case when the attachment bolts are inserted in the respective attachment holes.

According to the above configuration, since the case is made of a resin material, the weight of the control device can be reduced. The cover is pressed against the case not only by the cover bolts screwed into the respective screw holes in the case, but also by the attachment bolts screwed into the respective attachment holes in the attachment target. In this manner, the attachment bolts are screwed into the respective attachment target made of a metal material, and hence are less likely to become loose than the cover bolts screwed into the case made of a resin material. Therefore, even when the cover bolts become loose, the cover is pressed against and fixed to the cover by the attachment bolts. Accordingly, it is possible to suppress entry of fluid into the case.

In the above control device, projections facing heads of the respective attachment bolts in the assembly direction and having a projecting height equal to or less than a thickness of the cover may be provided at peripheral edges of the respective insertion holes in the case.

According to the above configuration, the axial force generated when screwing the attachment bolts into the attachment target is received by the projections, so that it is possible to suppress deformation of the face of the case at which the insertion holes is open due to the axial force.

The control device may include cylindrical collars that are inserted into the respective insertion holes, and an end portion of each of the collars may define one of the projections.

According to the above configuration, the axial force of the attachment bolts is received by the collars that are formed as separate members from the case, so that it is possible to appropriately suppress deformation of the case due to the axial force.

In the above control device, the collars may be made of a metal material.

According to the above configuration, the axial force of the attachment bolts that can be received by the collars is increased, so that the control device can be firmly attached to the attachment target.

In the above control device, the cover may include fitting portions that fit to the respective projections.

According to the above configuration, the cover can easily be positioned with respect to the case by fitting the fitting portions to the projections.

In the above control device, the cover and the attachment bolts may be made of a metal material, and a conductive member may be disposed between the cover and the circuit board to electrically conduct the cover and the circuit board.

According to the above configuration, the attachment target can be used to ground the circuit formed on the circuit board. This improves, for example, the noise resistance.

In the above control device, the cover and the attachment bolts may be made of a metal material, and the cover may include a radiation portion that is in contact with the circuit board.

According to the above configuration, heat generated by the circuit board is released by being transferred from the radiation portion to the cover, and then to the attachment target through the attachment bolts. In this manner, since heat is transferred to the attachment target, heat generated by the circuit board can be efficiently released.

In the above control device, the cover may have a raised portion at a part facing the circuit board, the raised portion being raised in a direction opposite to the case, and the attachment bolts may have a greater diameter than the cover bolts, and may be disposed closer to an outer peripheral edge of the cover than the cover bolts are.

It is necessary to have a clearance between each cover bolt and the raised portion and between each attachment bolt and the raised portion so as to place a tool for attaching the cover bolt and the attachment bolt. That is, the greater the outer diameter of a bolt is, the greater the outer diameter of the tool is. Therefore, if the attachment bolts having a greater diameter are disposed closer to the raised portion than the cover bolts having a smaller diameter are, the attachment bolts need to be greatly spaced apart from the raised portion, which results in an increased size of the cover. In this regard, according to the above configuration, since the attachment bolts having a greater diameter are disposed closer to the outer peripheral edge of the cover than the cover bolts having a smaller diameter are, the clearance between the raised portion and each cover bolt can be reduced. Therefore, it is possible to suppress an increase in the size of the cover.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein:

FIG. 3A is a cross-sectional view of the control device according to the embodiment (cross sectional view taken along the line of FIG. 2);

FIG. 3B is an enlarged cross-sectional view of an area around a side wall of the control device according to the embodiment;

DETAILED DESCRIPTION OF EMBODIMENTS

Hereinafter, a control device according to an embodiment will be described with reference to the drawings.

Figure 1:
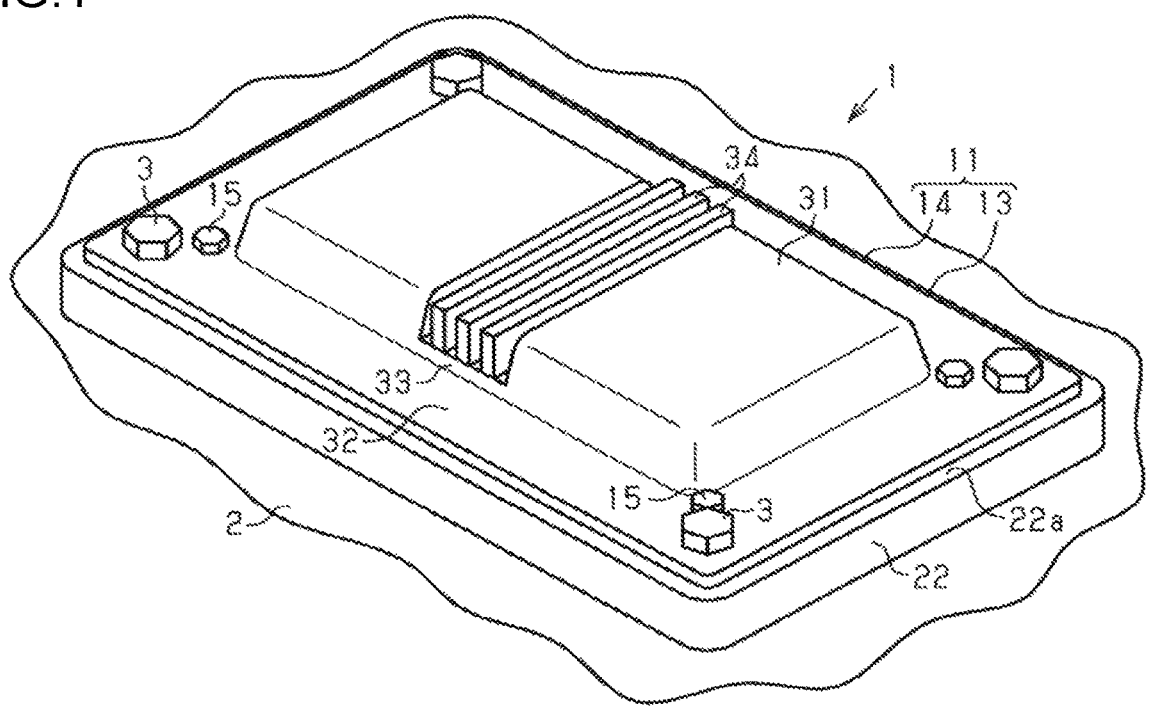
FIG. 1 is a perspective view of a control device according to an embodiment.

A control device 1 illustrated in FIG. 1 is used to control the operation of, for example, an electric oil pump. The control device 1 is fixed to an attachment target 2 made of a metal material, such as the body of a vehicle, by attachment bolts 3 made of metal.

Figure 2:
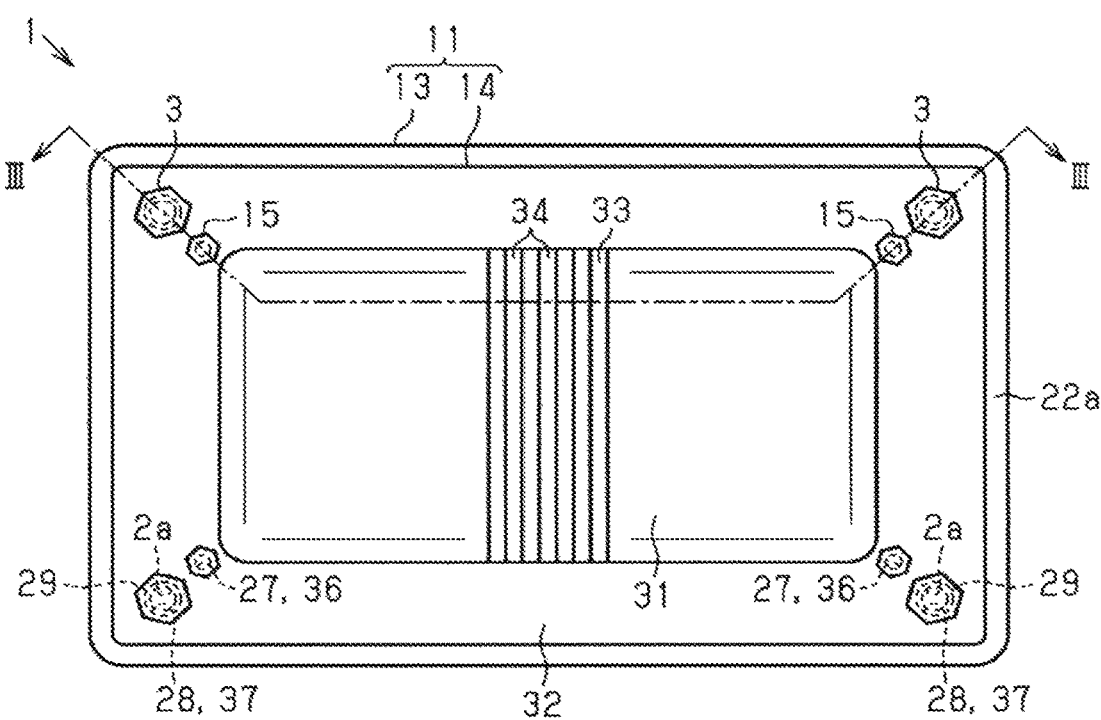
FIG. 2 is a plan view of the control device according to the embodiment.

As illustrated in FIGS. 2, 3A, and 3B, the control device 1 includes a housing 11 having a flat rectangular solid shape, and a plate-shaped circuit board 12 housed in the housing 11. The housing 11 includes a rectangular box-shaped case 13 with an open side, and a cover 14 that covers the open side of the case 13. The case 13 is made of a resin material, and the cover 14 is made of a metal material. The housing 11 is formed by assembling the cover 14 from the open side of the case 13, and fastening the cover 14 by cover bolts 15 made of metal. That is, the direction in which the case 13 is open corresponds to the assembly direction of the cover 14 (vertical direction in FIG. 3). An O-ring 16 serving as a seal member is interposed between the case 13 and the cover 14. Thus, the gap between the case 13 and the cover 14 is sealed, thereby preventing fluid such as water from entering the housing 11.

Specifically, the case 13 includes a bottom wall 21 having the shape of a rectangular plate, and a side wall 22 standing upright on the outer peripheral edge. A plurality of base portions 23 each having a cylindrical shape are formed on the bottom wall 21. The height of the base portions 23 (the length in the assembly direction) is substantially equal to the height of the side wall 22. The circuit board 12 is placed on the base portions 23, and is fixed by board bolts 24 that are screwed into the respective base portions 23. Various types of circuit elements 25 are mounted on both surfaces of the circuit board 12.

The side wall 22 is formed in the shape of a rectangular frame that is wide in the long-side direction and the short-side direction of the bottom wall 21, and an end face 22a of the side wall 22 on the open side is a flat surface. A seal groove 26 having the shape of a rectangular frame and extending throughout the periphery of the side wall 22 is formed in the end face 22a of the side wall 22 at a position close to the inner periphery. The O-ring 16 is inserted in the seal groove 26. A plurality of (four in the present embodiment) screw holes 27 are formed in the side wall 22 to be open at the end face 22a. The screw holes 27 are formed at four corners of the end face 22a on the outer peripheral side with respect to the seal groove 26. A plurality of (four in the present embodiment) insertion holes 28 are also formed to extend through the side wall 22 in the assembly direction of the cover 14. The insertion holes 28 are formed at four corners of the end face 22a close to the outer peripheral edge, and are aligned with the respective screw holes 27 on the outer peripheral side thereof.

Cylindrical collars 29 are inserted in the respective insertion holes 28. The collars 29 of the present embodiment are made of a metal material. The outer diameter of each collar 29 is substantially equal to the inner diameter of each insertion hole 28. The axial length of the collar 29 is set to be longer than the axial length of the insertion hole 28 such that an end portion 29a of the collar 29 projects beyond the end face 22a of the side wall 22. That is, the end portion 29a corresponds to a projection.

The cover 14 is formed in a substantially rectangular plate shape with raised and recessed portions. The cover 14 has a rectangular box-shaped raised portion 31 and a rectangular frame-shaped outer peripheral portion 32. The raised portion 31 is a part facing the circuit board 12 (bottom wall 21) and is raised in the direction opposite to the case 13. The outer peripheral portion 32 is a part facing the side wall 22 and extending from the raised portion 31 toward the outer peripheral side.

A radiation portion 33 is formed at substantially the center of the raised portion 31 in the long-side direction. The radiation portion 33 projects toward the case 13 and is in contact with the circuit board 12. A plurality of plate-shaped fins 34 each extending in the short-side direction are formed to be aligned in the long-side direction on the outer surface of the radiation portion 33 on the side opposite to the case 13. Heating elements 25a such as a switching element are mounted on the surface of the circuit board 12 opposite to the cover 14, at the positions corresponding to the radiation portion 33. A conductive member 35 made of an electrically conductive material is disposed between the raised portion 31 and the circuit board 12. The conductive member 35 of the present embodiment is formed in a spring shape. With the cover 14 fastened to the case 13, the conductive member 35 is in tight contact with the inner surface of the raised portion 31 and the circuit board 12 to electrically connect a circuit (not illustrated) formed on the circuit board 12 and the cover 14.

A plurality of (four in the present embodiment) through holes 36 are formed in the outer peripheral portion 32 at positions facing the screw holes 27 in the case 13. The through holes 36 extend through the cover 14 in the assembly direction of the cover 14. A plurality of (four in the present embodiment) fitting holes 37 serving as fitting portions are also formed in the outer peripheral portion 32 at positions facing the insertion holes 28 in the case 13. The fitting holes 37 extend through the cover 14 in the assembly direction of the cover 14. The inner diameter of the fitting holes 37 is substantially equal to the outer diameter of the collars 29, so that the fitting holes 37 fit to the end portions 29a of the respective collars 29. The thickness of the outer peripheral portion 32 is substantially equal to a projecting height of the collars 29 from the end face 22a. That is, the projecting height of the end portions 29a from the end face 22a is equal to or less than the thickness of the cover 14.

The cover 14 is fastened to the case 13 by screwing the cover bolts 15 into the screw holes 27 through the through holes 36. The housing 11 (control device 1) is attached to the attachment target 2 by screwing the attachment bolts 3 into attachment holes 2a formed in the attachment target 2 through the collars 29. In the present embodiment, the attachment bolts 3 have a greater diameter than the cover bolts 15. A head 3a of each attachment bolt 3 faces the corresponding collar 29 and a peripheral edge of the corresponding fitting hole 37 in the assembly direction, and presses the cover 14 against the case 13. That is, the attachment bolts 3 have a function of attaching the housing 11 to the attachment target 2, and also have a function of fastening the cover 14 to the case 13.

The advantageous effects of the present embodiment will be described.

(1) Since the case 13 is made of a resin material, the weight of the control device 1 can be reduced. Further, since the attachment bolts 3 are formed to press the cover 14 against the side wall 22 when inserted in the attachment holes 2a, the cover 14 is pressed against the case 13 not only by the cover bolts 15 screwed into the screw holes 27 in the case 13, but also by the attachment bolts 3 screwed into the attachment holes 2a in the attachment target 2. In this manner, the attachment bolts 3 are screwed into the attachment target 2 made of a metal material, and hence are less likely to become loose than the cover bolts 15 screwed into the case 13 made of a resin material. Therefore, even when the cover bolts 15 become loose, the cover 14 is pressed against and fixed to the case 13 by the attachment bolts 3. Accordingly, it is possible to suppress entry of fluid into the case 13.

(2) The control device 1 includes the cylindrical collars 29 that are inserted into the respective insertion holes 28. The end portions 29a of the collars 29 face the heads 3a of the respective attachment bolts 3 in the assembly direction, and the projecting height of the end portions 29a from the end face 22a is equal to or less than the thickness of the cover 14. With this configuration, the axial force of the attachment bolts 3 is received by the collars 29 that are formed as separate members from the case 13, so that it is possible to appropriately suppress deformation of the case 13 due to the axial force.

(3) Since the collars 29 are made of a metal material, the axial force of the attachment bolts 3 that can be received by the collars 29 is increased. Accordingly, the control device 1 can be firmly attached to the attachment target 2.

(4) Since the cover 14 has the fitting holes 37 to which the end portions 29a of the respective collars 29 fit, the cover 14 can easily be positioned with respect to the case 13 by fitting the end portions 29a to the fitting holes 37.

(5) The cover 14 and the attachment bolts 3 are made of a metal material, and the conductive member 35 is disposed between the cover 14 and the circuit board 12. Accordingly, the attachment target 2 having a greater volume than the cover 14 can be used to ground the circuit formed on the circuit board 12. This improves, for example, the noise resistance.

(6) The cover 14 has the radiation portion 33 that is in contact with the circuit board 12. Therefore, heat generated by the circuit board 12 is released by being transferred from the radiation portion 33 to the cover 14, and then to the attachment target 2 through the attachment bolts 3. In this manner, since heat is transferred to the attachment target 2 having a great volume, heat generated by the circuit board 12 can be efficiently released.

(7) The cover 14 has the raised portion 31 at a part facing the circuit board 12, and the attachment bolts 3 have a greater diameter than the cover bolts 15, and are disposed closer to the outer peripheral edge of the cover 14 than the cover bolts 15 are. It is necessary to have a clearance between each cover bolt 15 and the raised portion 31 and between each attachment bolt 3 and the raised portion 31 so as to place a tool for attaching the cover bolt 15 and the attachment bolt 3. The greater the outer diameter of a bolt is, the greater the outer diameter of the tool is. Therefore, if the attachment bolts 3 having a greater diameter are disposed closer to the raised portion 31 than the cover bolts 15 having a smaller diameter are, the attachment bolts 3 need to be greatly spaced apart from the raised portion 31, which results in an increased size of the cover 14. In this regard, according to the above configuration, since the attachment bolts 3 having a greater diameter are disposed closer to the outer peripheral edge of the cover 14 than the cover bolts 15 having a smaller diameter are, the clearance between the raised portion 31 and each cover bolt 15 can be reduced. Therefore, it is possible to suppress an increase in the size of the cover 14.

The present embodiment may be modified as described below. The present embodiment and the following modifications may be combined as long as no technical inconsistency arises.

In the above embodiment, the attachment bolts 3 may be disposed closer to the inner peripheral edge of the outer peripheral portion 32 than the cover bolts 15 are.

In the above embodiment, the attachment bolts 3 may have a smaller diameter than the cover bolts 15.

In the above embodiment, the cover 14 does not have to include the fins 34. Further, the cover 14 does not have to include the radiation portion 33.

In the above embodiment, the conductive member 35 does not have to be provided between the circuit board 12 and the cover 14.

Figure 4:
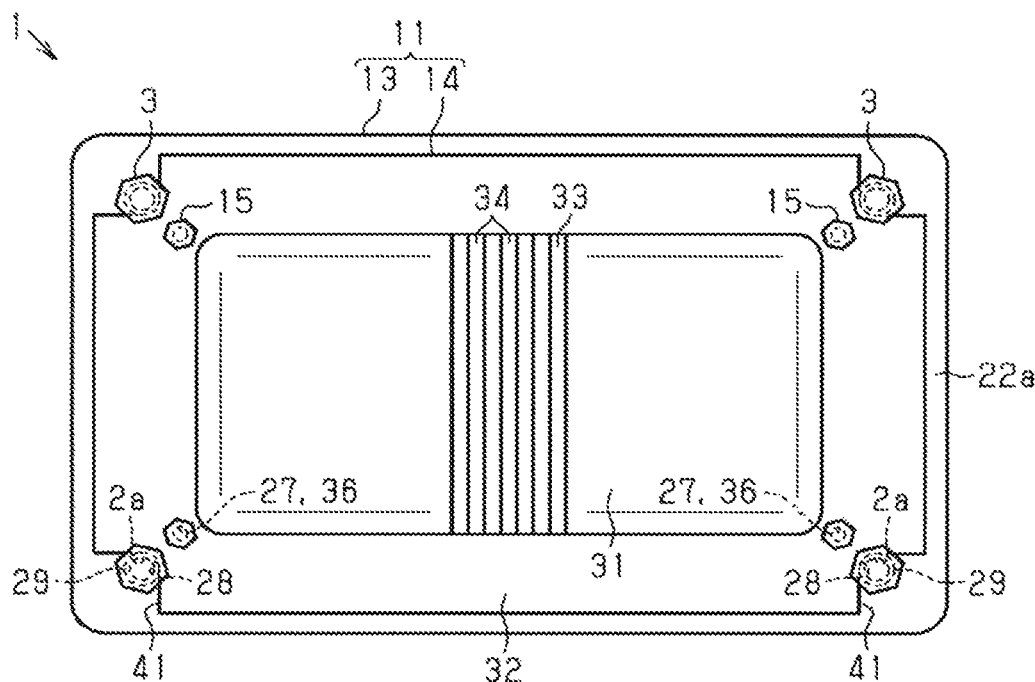
FIG. 4 is a plan view of a control device according to a modification.

In the above embodiment, the cover 14 has the fitting holes 37 to which the end portions 29a of the respective collars 29 fit. However, the present invention is not limited thereto. For example, as illustrated in FIG. 4, arcuate cutouts 41 may be formed, one at each of the four corners of the cover 14 such that the cutouts 41 fit to the end portions 29a. In this case, the cutouts 41 correspond to the fitting portions. The cover 14 does not have to have portions that fit to the end portions 29a of the respective collars 29 as long as the cover 14 is pressed by the heads 3a of the attachment bolts 3 against the case 13.

In the above embodiment, the collars 29 are made of a metal material. However, the present invention is not limited thereto. For example, the collars 29 may be made of a resin material.

Figure 5:
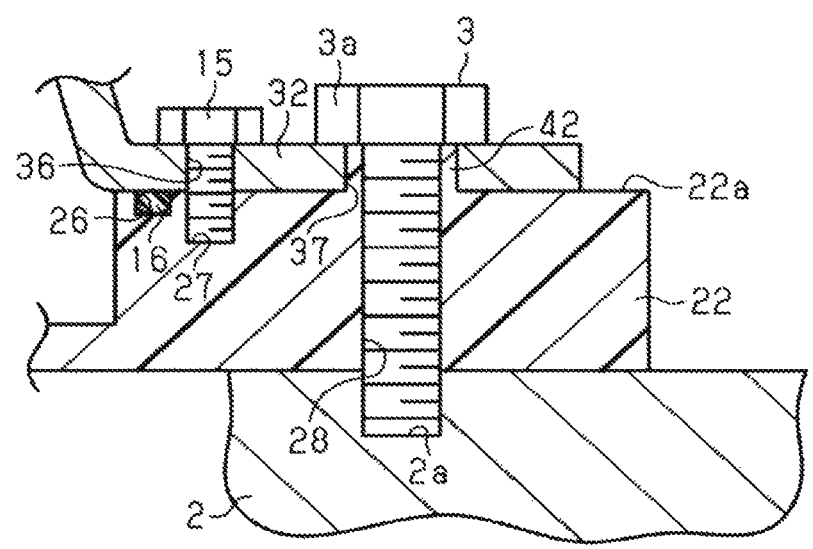
FIG. 5 is an enlarged cross-sectional view of an area around a side wall according to the modification.

In the above embodiment, as illustrated in FIG. 5, for example, the collars 29 may be omitted and, instead, annular projections 42 facing the heads 3a of the respective attachment bolts 3 in the assembly direction may be formed at the peripheral edges of the respective insertion holes 28 in the end face 22a of the case 13. Even with this configuration, the axial force generated when screwing the attachment bolts 3 into the attachment target 2 is received by the projections 42, so that it is possible to suppress deformation of the end face 22a of the side wall 22 due to the axial force. Alternatively, the collars 29 and the projections 42 on the end face 22a may be omitted.

In the above embodiment, the O-ring 16 is used as a seal member. However, the present invention is not limited thereto. For example, jelly-type adhesive or the like may be used.

In the above embodiment, the control device 1 may control devices other than the electric oil pump such as a motor. Further, the attachment target 2 may be any suitable part of a vehicle other than the body of a vehicle, as long as the part is made of a metal material.

What is claimed is:

1. A control device comprising:
a case made of a resin material and having an open side;
a cover that covers the open side of the case to define a housing when the cover is fastened to the case;
a circuit board housed in the housing; and
a seal member that seals between the case and the cover; wherein
screw holes that are open toward the cover are formed in the case;
through holes are formed in the cover at positions facing the respective screw holes;
the cover is fastened to the case by screwing cover bolts into the respective screw holes through the respective through holes;
insertion holes are formed to extend through the case in an assembly direction of the cover with respect to the case;
the housing is attached to an attachment target made of a metal material, by screwing attachment bolts into respective attachment holes in the attachment target through the respective insertion holes; and
the attachment bolts are formed to press the cover against the case when the attachment bolts are inserted in the respective attachment holes,
wherein projections are provided at peripheral edges of the respective insertion holes in the case, the projections facing heads of the respective attachment bolts in the assembly direction, and having a projecting height equal to or less than a thickness of the cover,
further comprising cylindrical collars that are inserted into the respective insertion holes; wherein
an end portion of each of the collars defines one of the projections.

2. The control device according to claim 1, wherein the collars are made of a metal material.

3. The control device according to claim 1, wherein:
the cover and the attachment bolts are made of a metal material; and
a conductive member is disposed between the cover and the circuit board to electrically conduct the cover and the circuit board.

4. The control device according to claim 1, wherein:
the cover and the attachment bolts are made of a metal material; and
the cover includes a radiation portion that is in contact with the circuit board.

5. The control device according to claim 1, wherein:
the cover has a raised portion at a part facing the circuit board, the raised portion being raised in a direction opposite to the case; and
the attachment bolts have a greater diameter than the cover bolts, and are disposed closer to an outer peripheral edge of the cover than the cover bolts are.

6. The control device according to claim 1, wherein projections are provided at peripheral edges of the respective insertion holes in the case, the projections facing heads of the respective attachment bolts in the assembly direction, and having a projecting height equal to or less than a thickness of the cover.

7. The control device according to claim 6, wherein the cover includes fitting portions that fit to the respective projections.

* * * * *